United States Patent [19]

Yamazaki et al.

[11] 4,330,778
[45] May 18, 1982

[54] DEVICE FOR DETECTING BROKEN FILAMENTS IN LAMPS

[75] Inventors: Kazuo Yamazaki, Fuchu; Katsumi Nomura, Hino; Osafumi Takemoto, Tokyo, all of Japan

[73] Assignee: Tokyo Shibaura Denki Kabushiki Kaisha, Japan

[21] Appl. No.: 127,053

[22] Filed: Mar. 4, 1980

[30] Foreign Application Priority Data

Mar. 13, 1979 [JP] Japan .................................. 54/28953

[51] Int. Cl.³ ............................................ G01R 25/00
[52] U.S. Cl. .................................. 340/642; 324/83 D
[58] Field of Search ............... 340/641, 642, 643, 658; 315/120, 131, 130; 324/83 D, 83 R

[56] References Cited

U.S. PATENT DOCUMENTS

| | | | |
|---|---|---|---|
| 3,054,991 | 9/1962 | Howell | 340/642 |
| 3,663,956 | 5/1972 | Purdy et al. | 324/83 D |
| 3,715,741 | 2/1973 | McWade et al. | 340/642 |
| 3,820,022 | 6/1974 | Watt | 324/83 D |
| 3,829,735 | 8/1974 | Berlock et al. | 340/642 |
| 3,906,361 | 9/1975 | Nessler et al. | 324/83 D |
| 3,953,794 | 4/1976 | Moore | 324/83 D |
| 4,001,682 | 1/1977 | Watt | 324/83 D |

*Primary Examiner*—Gerald L. Brigance
*Attorney, Agent, or Firm*—Stevens, Davis, Miller & Mosher

[57] ABSTRACT

In a device for detecting broken filaments of lamps which are connected with secondary windings of transformers respectively provided for the lamps, primary windings of the transformers being connected in series across an AC power source through a power control device, there are provided a detector for detecting voltage and current delivered from the power control device, and another detector for detecting a phase difference between the voltage and the current thus detected by the voltage and current detector.

8 Claims, 10 Drawing Figures

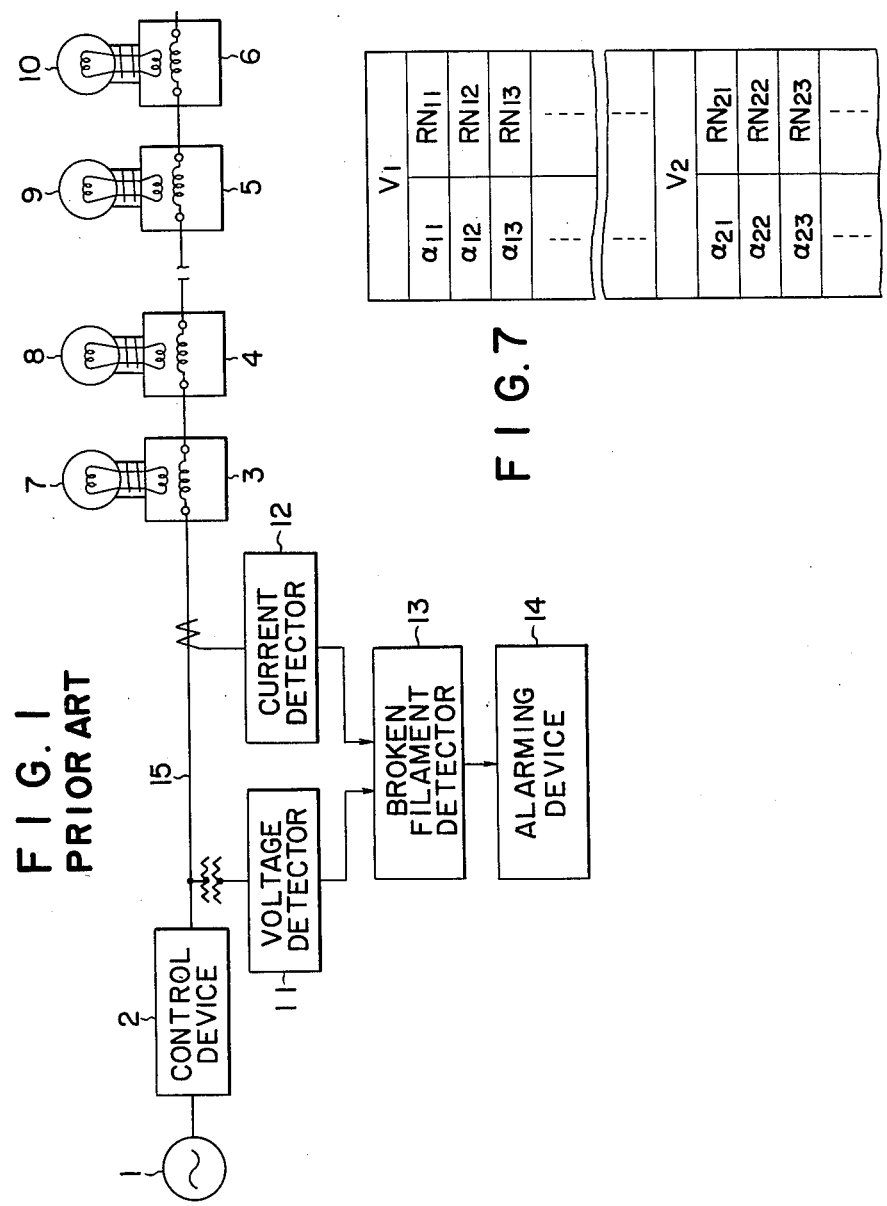

FIG. 2(a)
PRIOR ART
201 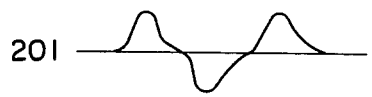
202 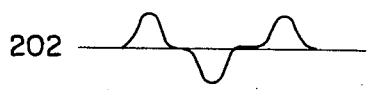
203 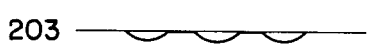
FIG. 2(b)
PRIOR ART
201 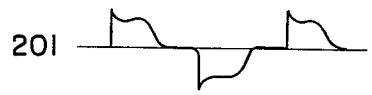
202 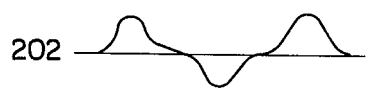
203 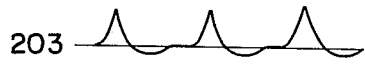
FIG. 3(a)
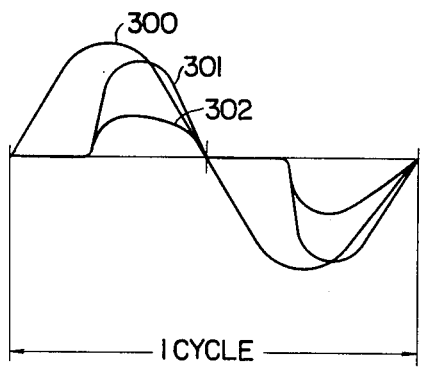
FIG. 3(b)
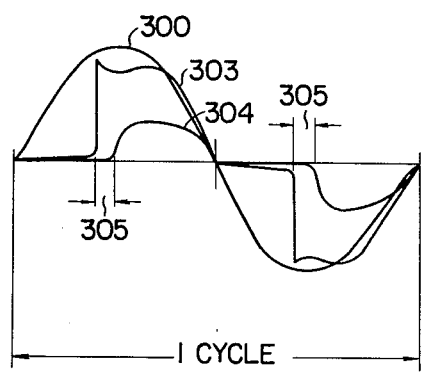

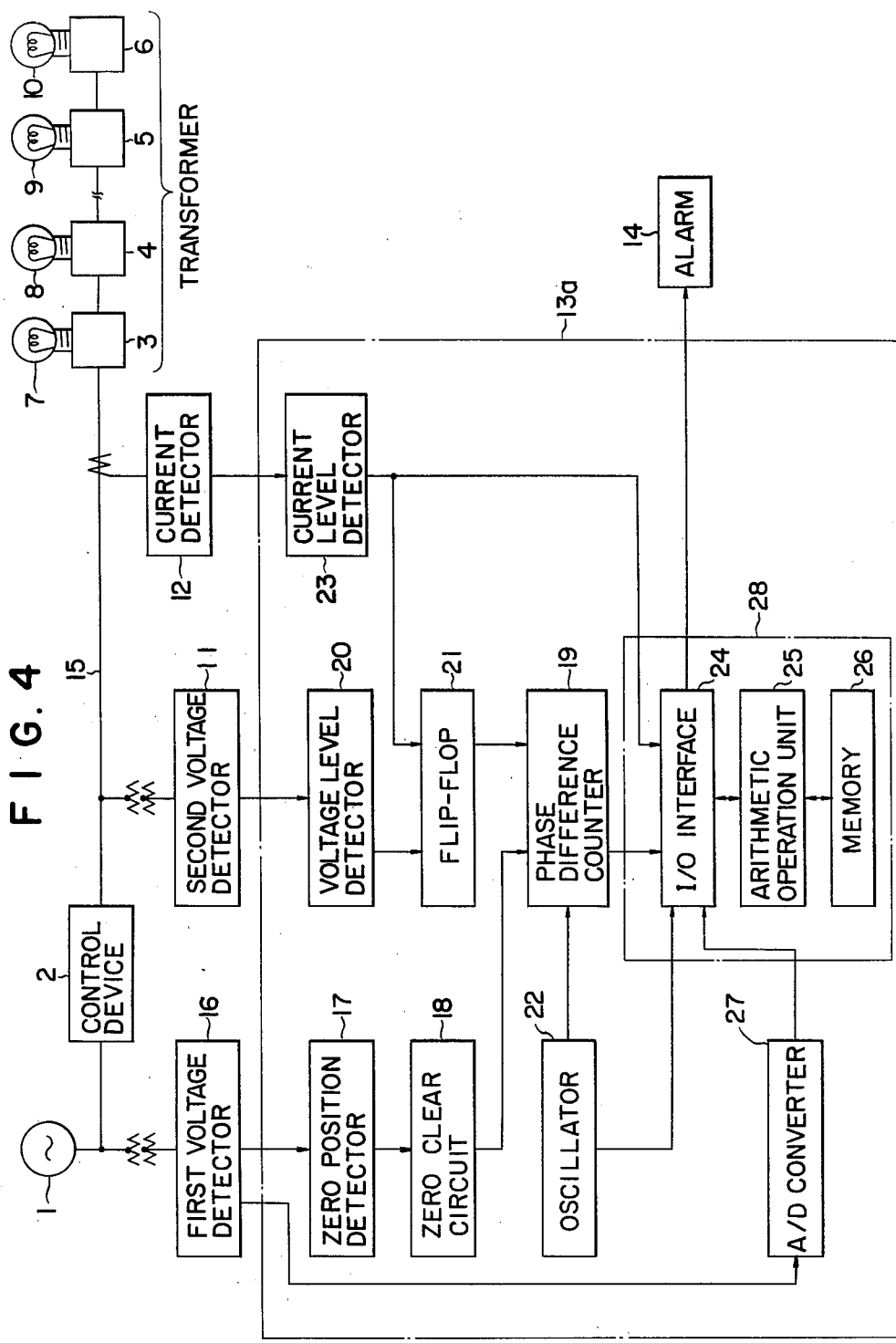

DEVICE FOR DETECTING BROKEN FILAMENTS IN LAMPS

BACKGROUND OF THE INVENTION

This invention relates to a device for detecting broken filaments of lamps which are used for illuminating a wide area such as an airport.

When illuminating a wide area such as an airport, it is an ordinary practice to divide a plurality of such lamps as tungsten lamps, mercury lamps, halogen lamps, and the like into several groups in accordance with their application and the convenience of controls, each group being connected in series for the purpose of equalizing the light intensities and decreasing the installation cost of the lamps. More specifically, lighting transformers 3, 4, 5, and 6 are provided for respective lamps, and the primary windings of the lighting transformers 3, 4, 5, and 6 are connected in series, while the secondary windings thereof are connected respectively with lamps 7, 8, 9, and 10 as shown in FIG. 1. The serially connected transformers are connected with an AC power source 1 through a control device 2.

The control device 2 includes a current-controlling means utilizing thyristors (SCR) or a group of elements connected to a resonance circuit of, for instance, CR type including capacitors and resistors.

A voltage detecting device 11 and a current detecting device 12 are further provided in a well known manner so that the output voltage and the output current delivered from the control device 2 can be detected.

The outputs of the devices 11 and 12 are supplied to a broken filament detecting device 13 wherein the voltage and the current detected by the detecting devices 11 and 12 are rectified, and the areas defined by the waveforms of the thus rectified voltage and current are determined. The ratios of the determined areas to predetermined standard values are compared with each other, and the difference is further compared with a predetermined value. When the difference between the area ratios is greater than the predetermined value, it is judged that one or more filaments of the lamps are broken. Herein the term "filament" is defined to indicate not only a filament but also an element of a lamp, a failure thereof renders the lamp inoperative.

When the comparator detects the fact that the difference between the two areas ratios is greater than the predetermined value, the device 13 delivers an output to an alarming device 14, such as a buzzer.

FIGS. 2(a) and 2(b) are waveform diagrams for the two cases, one having no broken filament and the other having one or more filaments broken. In these figures, numeral 201 designates the waveform of a voltage detected by the voltage detecting device 11, numeral 202 the waveform of a current detected by the current detecting device 12, and numeral 203 the difference between the area ratios of the waveforms 201 and 202, which is compared with a predetermined value.

As is apparent in FIG. 2(b) showing a case in which one or more filaments are broken, the voltage waveform 201 rises up sharply while the current waveform 202 rises up slowly. For this reason, the difference 203 between the area ratios of the voltage and the current in FIG. 2(b) becomes greater than the difference 203 in FIG. 2(a), and the percentage of the lamps having broken filaments against the entire lamps (hereinafter termed "percentage of the broken filaments") can be detected by comparing the difference 203 in FIG. 2(b) with a predetermined value which has been selected to be greater than the difference 203 in FIG. 2(a).

The above described conventional broken filament detecting device 13, however, tends to deliver an erroneous output to the alarming circuit 14 when the voltage waveform 201 or the current waveform 202 is greatly deformed by external noises and the like, to which the analogue values of the voltage and the current are susceptible. For obviating this disadvantage, if a large value is selected for the predetermined value to be compared with the aforementiond difference, the sensitivity of detecting broken filaments is reduced, and the detection of the broken filaments at a high precision is made difficult.

Furthermore, it is known that the waveforms of the voltage and current are substantially affected by the characteristics of each of the lighting transformers. Thus when a faulty transformer is replaced by a new transformer, an adjustment is required for equalizing the characteristics of the entire load before and after the replacement.

In addition, various disadvantages have been revealed with the conventional device. For instance, an additional circuit is required when an addition of any other function is desired, or it is difficult to memorize various detected values temporarily when the variation of characteristics of the detected values is required to be surveyed for a considerably long period.

SUMMARY OF THE INVENTION

A primary object of the present invention is to provide a device for detecting broken filaments of lamps, which is not susceptible to external noise and the like.

Another object of the invention is to provide a device for detecting broken filaments of lamps which is reliable in operation and simple in construction.

Still another object of the invention is to provide a device for detecting broken filaments of lamps, which does not require adjustment of the lighting transformers even after faulty transformers have been replaced.

Still another object of the invention is to provide a device for detecting broken filaments of lamps, which does not require additional circuitries for providing additional functions.

Still another object of the invention is to provide a device for detecting broken filaments of lamps, which can memorize various detected values for determining long-term characteristics of these values.

These and other objects of the present invention can be achieved by providing a device for detecting broken filaments of lamps which are connected with secondary windings of transformers respectively provided for the lamps, primary windings of the transformers being connected in series across an AC power source through a power control device of a constant current type including switching elements, the broken filament detecting device comprising means for detecting voltage delivered from the power control device to be applied across the serially connected transformers, means for detecting current delivered from the power control device to the series connected primary windings of the transformers, and means for detecting a phase difference between the voltage and the current detected by the voltage detecting means and the current detecting means.

In an embodiment of the invention, the aforementioned means for detecting the phase difference between the voltage and the current is made into a digital type.

In another embodiment of the invention, the broken filaments detecting device further comprises means for detecting predetermined points in the waveforms of the voltage and current, means for detecting a time difference between the predetermined points in the voltage and current, an oscillator delivering a train of pulses, and means for counting the number of the pulses delivered from the oscillator during the time difference thus detected. A data input-and-output interface may further be provided for supplying therethrough a data related to a variation of the phase difference between the voltage and the current in accordance with the number of the broken filaments.

BRIEF DESCRIPTION OF THE DRAWINGS

In the accompanying drawings:

FIG. 1 is a schematic wiring diagram of an illuminating circuit wherein a conventional broken filament detecting device is used;

FIGS. 2(a) and 2(b) are diagrams showing waveforms in the circuit for the cases where no filament is broken and some filaments are broken;

FIGS. 3(a) and 3(b) are diagrams explaining the relation between a power source voltage, load voltage, and a load current in the cases where no filament is broken and some filaments are broken;

FIG. 4 is a block diagram showing a broken filament detecting device according to the present invention;

FIG. 7 is a data table showing the relation of FIG. 6 in a digital manner; and

DESCRIPTION OF PREFERRED EMBODIMENTS

Figure 5:
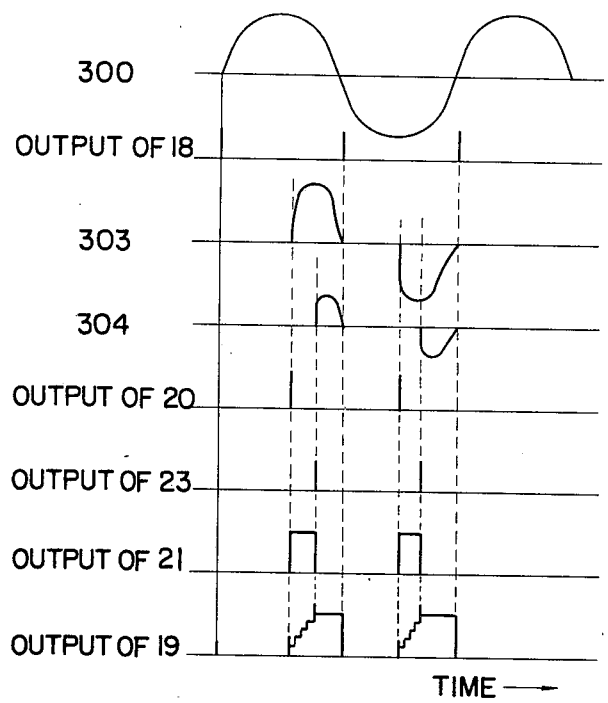
FIG. 5 is a timing chart showing the operation of the device shown in FIG. 4.

The principle of the present invention will now be described with reference to FIGS. 3(a) and 3(b) showing the relation between the power source voltage and the output voltage and current (hereinafter termed controlled voltage and controlled current) of a power controlling device such as the device 2 in FIG. 1.

More specifically, FIG. 3(a) shows a relation between the power source voltage 300, controlled voltage 301, and the controlled current 302 when none of the filaments is broken, whereas FIG. 3(b) shows a relation between the power source voltage 300, controlled voltage 303, and the controlled current 304 when some filaments are broken. Numeral 305 designates the phase difference between the voltage 303 and the current 304.

In the case wherein there is no broken filament, the instant when the controlled voltage 301 rises up is substantially simultaneous with the rising instant of the controlled current 302, and therefore the phase difference between the voltage and the current is substantially zero as is apparent from FIG. 3(a).

However, when some of the filaments of lamps are broken, a phase difference 305 increasing in accordance with the percentage of the broken filament appears between the controlled voltage 303 and the controlled current 302 as shown in FIG. 3(b).

The phase difference 305 is stable against noises, and since the determination of the phase difference 305 merely requires the detection of two points regarding the levels of the controlled voltage 303 and the controlled current 304 while the determination of the areas of the voltage 201 and the current 202 according to conventional procedure requires the measurement of the waveforms at a number of points along the time axes, respectively, the determination of the phase difference 305 affords the detection of the broken filaments at a higher accuracy and reliability than by the determination of the areas of the voltage and the current.

In a circuit shown in FIG. 4 wherein a preferred embodiment of the present invention is utilized, the primary windings of transformers 3, 4, 5, and 6 are connected in series across an AC power source 1 through a power controlling device 2, and the secondary windings of these transformers are connected respectively to the filaments of lamps 7, 8, 9, and 10 as in the conventional connection shown in FIG. 1.

According to the embodiment shown in FIG. 4, a first voltage detector 16 is connected to the power source 1 so that the voltage of the power source 1 is detected by the detector 16. A zero-position detector 17 is connected to receive the output of the first voltage detector 16 for delivering at each zero point an output signal to a zero-clear circuit 18.

A second voltage detector 11 is provided to detect the controlled voltage delivered from the power controlling device 2 and to transfer the thus detected voltage to a level detecting circuit 20. The level detecting circuit 20 compares the voltage with a predetermined value, and when the detected voltage exceeds the predetermined value delivers a set signal to a flip-flop 21. When the flip-flop 21 receives the set signal, the flip-flop 21 changes its output from "0" to "1" and vice versa.

A phase difference counter 19 is connected to receive the outputs of the flip-flop 21, an oscillator 22 delivering a pulse train, and of the zero-clear circuit 18. When the output of the flip-flop 21 becomes "1," the phase difference counter 19 starts to count the number of the output pulses delivered from the oscillator 22. When the output of the flip-flop 21 becomes "0," the phase difference counter 19 terminates the counting operation, and when the counter 19 receives the output of the zero-clear circuit 18, the count of the phase difference counter 19 is cleared.

On the other hand, a current detector 12 is provided for detecting the control current from the power controlling device 2. When the control current from the current detector 12 exceeds a predetermined level, a circuit 23 delivers a set signal to the flip-flop 21 thereby changing the output of the flip-flop 21.

FIG. 5 is a chart showing the timing of various signals and operations. As described above, when the level determining circuit 20 delivers a set signal, the output of the flip-flop 21 is changed to "1," and the phase difference counter 19 starts to count the number of the output pulses of the oscillator 22.

It should be noted that the count of the phase difference counter 19 has been cleared to zero upon reception of an output from the zero clear circuit 18.

When the current value detected by the controlled current detector 12 exceeds a predetermined value, the level detecting circuit 23 delivers a set signal to the flip-flop 21 thereby changing its output from "1" to "0." Upon reception of the output "0" from the flip-flop 21, the phase difference counter 19 stops counting of the number of output pulses of the oscillator 22, holding the count as it is.

The count thus held in the counter 19 and corresponding to the phase difference 305 is then delivered to an input-output interface 24 connected to an arithmetic operational unit 25 in an arithmetic operational control device 28.

The output of the level detecting circuit 23 is also supplied to the input-output interface 24 as an interruption signal. Furthermore, the output of the first voltage detector 16 is connected through an A/D converter 27 to the input-output interface 24. The operational unit 25 thus receives the digitalized phase difference and the digitalized power source voltage through the input-output interface 24. The phase difference and the power source voltage thus received in the operational circuit 25 are utilized therein as basic data for calculating the percentage of the broken filament in lamps.

Figure 6:
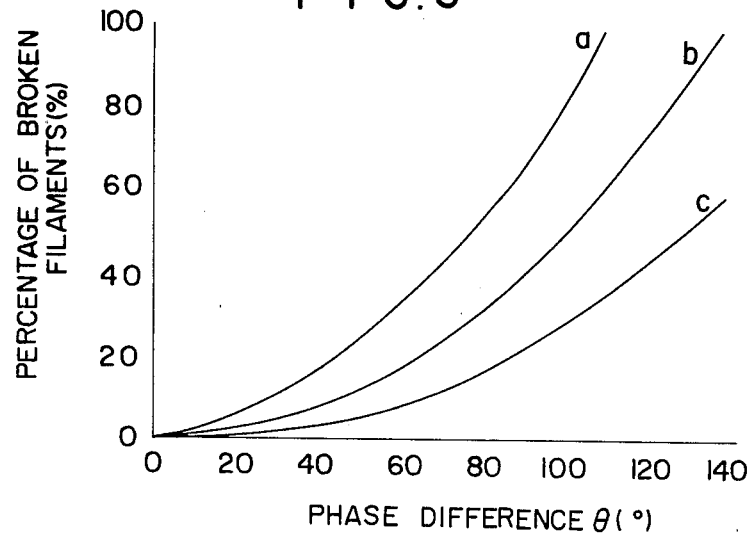
FIG. 6 is a graph showing the relation between the phase difference between the voltage and the current and the percentage of the broken filaments in lamps.

The percentage of the broken filament varies in accordance with the variation of the phase difference (in $\theta°$) as shown in FIG. 6. Thus when the phase difference between the voltage and the current is obtained, the percentage of the broken filament can be calculated from the relations shown for the different power source voltages by curves a, b, and c in FIG. 6 (wherein the power source voltages for the curves a, b, and c are high in this order).

For the purpose of calculating the percentage of the broken filaments in the operational unit 25, the relation between the phase difference and the percentage of the broken filaments is tabulated in FIG. 7 together with the power source voltage, such as $V_1, V_2, \ldots$, and lagging phase angle, such as $\alpha_{11}, \alpha_{12}, \ldots, \alpha_{21}, \alpha_{22}, \ldots$, and the tabulated data are memorized in a memory device 26 connected to the operational unit 25 in the operational control device 28.

The operational circuit 25 receiving the phase difference and the power source voltage through the input-output interface 24 firstly subjects the two values to a preprocessing such as averaging, thereby removing noises and the like liable to be contained in these values, and then extracts a value of the percentage of the broken filaments corresponding to the phase difference and power source voltage from the data table as shown in FIG. 7.

The operational unit 25 further checks whether the percentage of the broken filaments thus extracted is permissible or not. When the percentage of the broken filament is larger than a predetermined value, the unit 25 judges that the illuminating system is faulty, and issues an alarming signal through the I/O interface 24 to the alarming device 14. The alarming device 14 may be of an audible type such as a buzzer, or a visual type such as an alarming lamp and a displaying system.

Among the above described sequence of operations, those starting from the phase difference counter 19 and the A/D converter 27 to convert the power source voltage, down to the process for obtaining the percentage of the broken filaments, are performed in digital forms. As a consequence, the operational control device 28 may be substituted by a computer or the like, and an advantageous feature of increasing the versatility can be thereby obtained.

Figure 8:
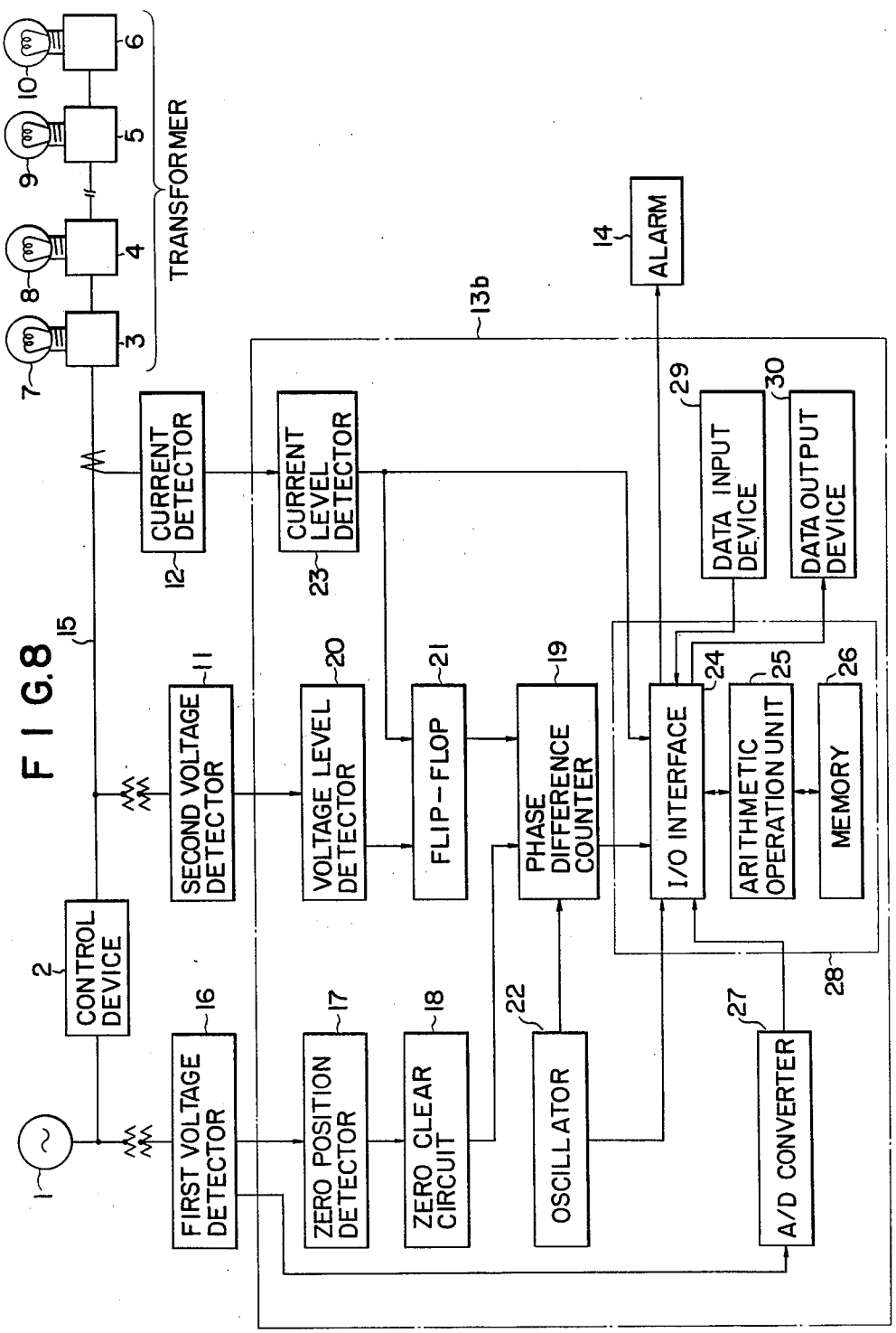
FIG. 8 is a block diagram showing another embodiment of the invention.

An example of such a construction is illustrated in FIG. 8 wherein a data input device 29 and a data output device 30 are added to the broken filament detecting device shown in FIG. 4.

The data input device 29 and the data output device 30 are used for setting data in the operational unit 25 and in the memory device 26, and for referring to these data from outside. More specifically, the contents of the data table, such as the power source voltages $V_1, V_2, \ldots$, lagging phase angles $\alpha_{11}, \alpha_{12}, \alpha_{13}, \ldots$, and $\alpha_{21}, \alpha_{22}, \alpha_{23}, \ldots$, and the percentage of the broken filaments $RN_{11}, RN_{12}, \ldots$ and $RN_{21}, RN_{22}, RN_{23}, \ldots$, which have been memorized in the memory device 26, can be altered or referred to from outside.

In a practical example, new data for replacing the contents are supplied through the data input device 29 and the I/O interface 24 to the operational unit 25 which substitutes the old data stored in the memory device 26 with new data.

The contents of the memory device 26 used for detecting the percentage of the broken filaments may otherwise be displayed through the data output device 30, or the alarming device 15 may be operated when a fault occurs in the broken filament detecting device.

Furthermore, when a data input terminal and a data output terminal are provided in the data input device 29 and the data output device 30, respectively, and a central control device (not shown) is connected to the two terminals, data can be exchanged between the central control device and the broken filament detecting device according to this invention, and the central control of the latter device can be thereby realized.

Although the present invention has been described with respect to preferred embodiments thereof for determining phase difference between the voltage and the current, it will be apparent to those skilled in the art that various modifications or alterations may be made within the scope of the present invention.

For instance, various protective relays such as distance relays, reactance relays, ohm-type relays, offset-mho type relays, reactive power relays, and the like may also be used for detecting broken filaments of lamps when these are connected to the voltage detecting device 11 and the current detecting device 12 of the circuit as shown in FIG. 1.

We claim:

1. A device for detecting broken filaments of lamps which are connected with secondary windings of transformers respectively provided for said lamps, said transformers having primary windings connected in series across an AC power source through a power control device of a constant current type including switching elements, said device for detecting broken filaments comprising:
   first means for constantly detecting an output voltage of said power control device to be applied across the serially connected transformers, said means producing a first output signal when the detected voltage exceeds a predetermined value;
   second means for constantly detecting current delivered from said power control device to said serially connected primary windings of the transformers to produce a second output signal when the detected current exceeds a predetermined value;
   third means connected to receive said first output signal and said second output signals for detecting a phase difference between said first output signal and said second output signal;
   fourth means for detecting a magnitude of the AC power source voltage; and
   fifth means connected to receive an output voltage of said third means representing the phase difference and an output voltage of said fourth means representing the magnitude of the AC power source voltage for delivering an output signal representing the number of broken filaments of said lamps.

2. A device as set forth in claim 1 wherein said means for detecting the phase difference is of a digital type.

3. A device as set forth in claim 2, wherein said third means for detecting the phase difference detects a time difference between said first output signal and said second output signal.

4. A device as set forth in claim 3, wherein said third means comprises:
an oscillator for delivering a train of pulses; and
means for counting the number of the pulses delivered from said oscillator for a time period corresponding to said time difference.

5. A device as set forth in claim 1, wherein said fifth means comprises a memory device, and an input-output interface through which data related to the phase difference, the number of broken filaments, and the magnitude of the AC power source are stored in or read out of said memory device.

6. A device as set forth in claim 5, wherein said fifth means further comprises a data input device and a data output device, both connected to said input-output interface.

7. A device as set forth in claim 1, wherein said first means for detecting an output voltage includes a second voltage detector for detecting the output voltage of said power control device and a voltage level detector which delivers said first output signal when the output voltage exceeds a predetermined value, said second means includes a current detector for detecting the current delivered from said power control device and a current level detector which delivers said second output signal when the current from said device exceeds a predetermined value, said means for detecting the phase difference includes a first voltage detector for detecting the magnitude of the AC power source voltage, a zero-position detector for detecting zero-positions of the power source voltage, a zero-clear circuit for producing zero-clear pulses at the zero-positions of the power source voltage, an oscillator for delivering a pulse train, a flip-flop connected to receive said first and second output signals for delivering an output corresponding to the time difference between said first and second output signals, a phase difference counter connected to receive the output of the flip-flop, the output of the oscillator and the output of the zero-clear circuit for delivering a number of pulses indicative of the time difference, said fourth means which detects a magnitude of the AC power source voltage includes said first voltage detector and an A/D converter connected to the first voltage detector for digitalizing the power source voltage and said fifth means includes an arithmetic operation control device connected to receive the outputs of said phase difference counter, A/D converter, current level detector and the oscillator for delivering an output signal indicating the number of broken filaments of said lamps.

8. A device as set forth in claim 7, wherein said arithmetic operation control device comprises:
an input-output interface connected to receive the outputs of said phase difference counter, A/D converter, current level detector and said oscillator;
a memory device for storing data related to the phase difference versus the number of broken filaments; and
an arithmetic operation unit operative according to said data for delivering an output through said input-output interface.

* * * * *